(12) United States Patent
Ollier et al.

(10) Patent No.: US 9,444,371 B2
(45) Date of Patent: Sep. 13, 2016

(54) DEVICE FOR RECOVERING AND CONVERTING HEAT ENERGY INTO ELECTRICAL ENERGY

(71) Applicants: Commissariat a l'energie atomique et aux ene alt, Paris (FR); STMICROELECTRONICS (CROLLES 2) SAS, Crolles (FR)

(72) Inventors: Emmanuel Ollier, Grenoble (FR); Stephane Monfray, Eybens (FR); Thomas Skotnicki, Crolles-Monfort (FR); Ulrich Soupremanien, Grenoble (FR)

(73) Assignees: Commisariat a l'energie atomique et aux energies alternatives, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 188 days.

(21) Appl. No.: 14/378,267

(22) PCT Filed: Feb. 13, 2013

(86) PCT No.: PCT/EP2013/052815
§ 371 (c)(1),
(2) Date: Aug. 12, 2014

(87) PCT Pub. No.: WO2013/120869
PCT Pub. Date: Aug. 22, 2013

(65) Prior Publication Data
US 2015/0001990 A1 Jan. 1, 2015

(30) Foreign Application Priority Data
Feb. 14, 2012 (FR) ...................... 12 51368

(51) Int. Cl.
*H02N 2/18* (2006.01)
*H01L 41/047* (2006.01)
*H01L 41/08* (2006.01)

(52) U.S. Cl.
CPC ............ *H02N 2/185* (2013.01); *H01L 41/047* (2013.01); *H01L 41/08* (2013.01); *H02N 2/18* (2013.01)

(58) Field of Classification Search
CPC ...... H02N 2/185; H02N 2/18; H01L 41/047; H01L 41/08
USPC ........... 60/670–682; 310/311, 341, 342, 343, 310/344, 346
See application file for complete search history.

(56) References Cited

U.S. PATENT DOCUMENTS 6,360,775 B1 3/2002 Bartha et al.
7,411,337 B2 * 8/2008 Tadayon ................. F01K 3/185
310/339

(Continued)

FOREIGN PATENT DOCUMENTS

| CN | 101390228 A | 3/2009 |
|---|---|---|
| CN | 101765926 | 6/2010 |
| CN | 102152629 | 8/2011 |
| FR | 2 951 874 | 4/2011 |

OTHER PUBLICATIONS

International Search Report Issued Mar. 28, 2013 in PCT/EP13/052815 Filed Feb. 13, 2013.

(Continued)

*Primary Examiner* — Hoang Nguyen
(74) *Attorney, Agent, or Firm* — Oblon, McClelland, Maier & Neustadt, L.L.P.

(57) ABSTRACT

A device for converting heat energy into electrical energy including cells, the cells including: a first cavity with one wall for contacting a heat source; a second cavity with one wall for contacting a cold source; a primary channel between the first cavity and the second cavity transporting a fluid as liquid drops, the primary channel providing transport of liquid fluid drops from the second cavity to the first cavity; at least one secondary channel between the first cavity and the second cavity transporting the fluid as a gas; a piezoelectric material provided in one of the cavities; and a fluid as a liquid and gas contained within the cell.

22 Claims, 4 Drawing Sheets

(56) References Cited

U.S. PATENT DOCUMENTS

| | | | |
|---|---|---|---|
| 7,800,278 B2 | 9/2010 | Ujihara et al. | |
| 8,378,558 B2* | 2/2013 | Skotnicki | H02N 2/18 310/339 |
| 2006/0173344 A1* | 8/2006 | Marian | A61B 8/00 600/459 |
| 2007/0012051 A1* | 1/2007 | Acton | A23G 9/00 62/70 |
| 2008/0202114 A1 | 8/2008 | Naterer et al. | |
| 2011/0095655 A1 | 4/2011 | Skotnicki | |
| 2014/0158334 A1 | 6/2014 | Dellea et al. | |
| 2014/0166085 A1 | 6/2014 | Ollier | |
| 2014/0174085 A1* | 6/2014 | Kare | F01K 11/00 60/670 |
| 2015/0021720 A1 | 1/2015 | Ollier et al. | |

OTHER PUBLICATIONS

French Search Report Issued Nov. 20, 2012 in French Application No. 12 51368 Filed Feb. 14, 2012.

U.S. Appl. No. 14/378,267.

U.S. Appl. No. 14/232,092, filed Apr. 3, 2014, Savelli, et al.

U.S. Appl. No. 14/335,175, filed Jul. 18, 2014, Ollier, e t al.

Preliminary Search Report issued Nov. 20, 2012 in European Patent Application No. FR 1251368 (with English translation of category of cited documents).

S. Whalen, et al., "Design, fabrication and testing of the $P^3$ micro heat engine", Sensors and Actuators A ,Physical, 104, (2003), pp. 290-298.

Till Huesgen, et al., "A novel self-starting mems-heat engine for thermal energy harvesting", Micro Electro Mechanical Systems (MEMS), 2010, IEEE $23^{rd}$ International Conference, Jan. 24-28, 2010 pp. 1179-1182.

T. Huesgen, et al., "Detailed study of a micro heat engine for thermal energy harvesting", Journal of Micromechanics and Microengineering, 20, 2010, 10 pages.

Office Action mailed Jun. 2, 2016 in Chinese Patent Application No. 201380009315.6 (with English Translation).

* cited by examiner

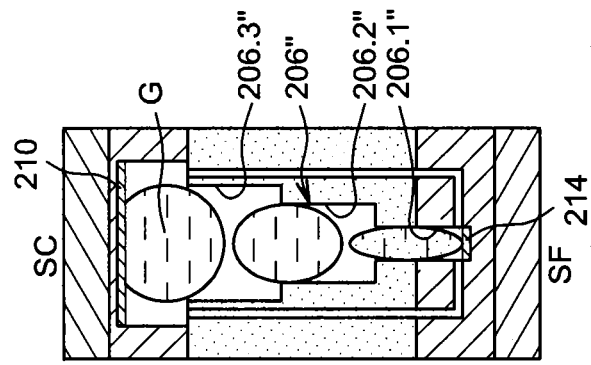
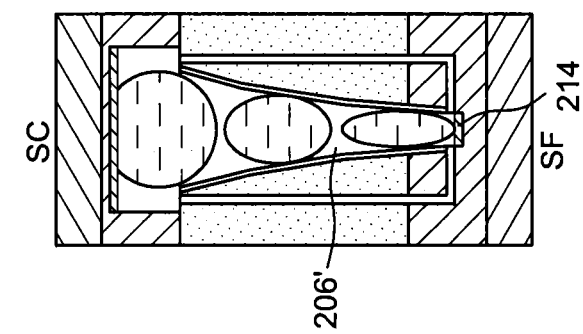
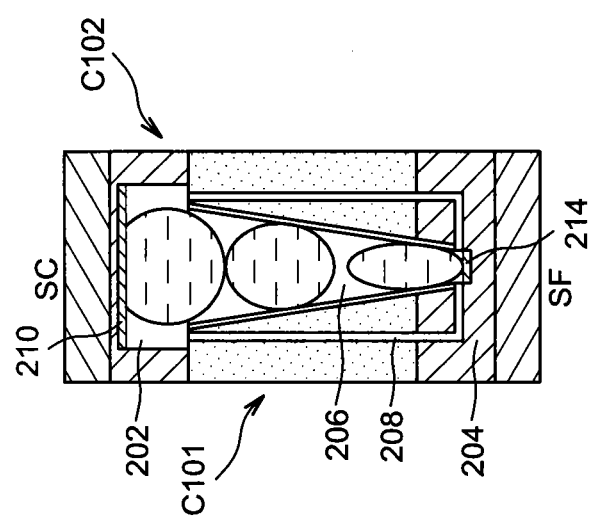

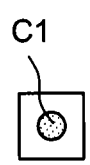
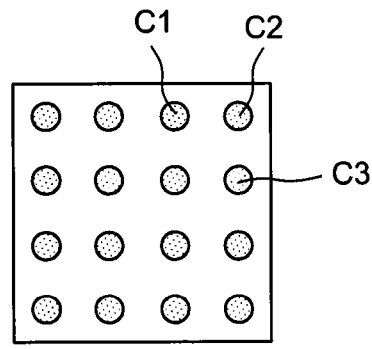
FIG. 5A
FIG. 5B
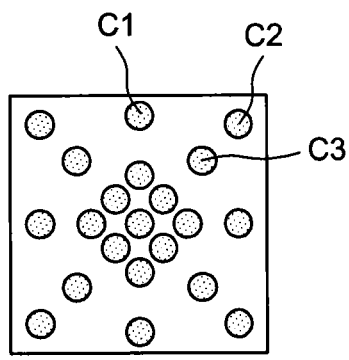
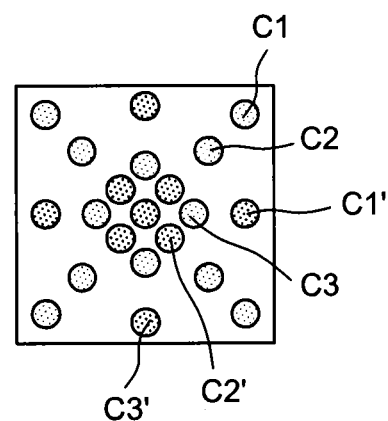
FIG. 5C
FIG. 5D

DEVICE FOR RECOVERING AND CONVERTING HEAT ENERGY INTO ELECTRICAL ENERGY

TECHNICAL FIELD AND PRIOR ART

The present invention relates to a device for recovering and converting heat energy into electrical energy using phase change of a fluid.

Electronic circuits, upon operating, produce heat. This heat is not used and should be discharged in order not to deteriorate the circuits. Other heat sources are also present in our environment, such as for example pipings, exhausts, industrial machine walls, . . . , the discharged heat of which is unused.

It is contemplated to recover this heat to convert it into electrical energy.

Devices implementing a liquid-vapour phase change have been proposed.

For example, the document FR 2 951 874 describes a device comprising an enclosed volume bounded by a first wall for contacting a hot source and a second wall facing the first wall for contacting a cold source, a layer of piezoelectric material suspended in the enclosed volume between both walls, wherein apertures are passing through the layer. A liquid is provided in the enclosed volume. The second wall is provided below the first wall. The operation of this device is the following:

- the liquid flows by gravity through the apertures towards the second wall. When it contacts the second wall, it is abruptly vaporised, which results in generating a strong overpressure and strong mechanical stresses which are transmitted to the piezoelectric layer which transforms them into an electrical signal,
- the vapour passes through the apertures in the piezoelectric layer towards the first wall, where it is condensed, and
- the liquid flows again to the second wall by gravity and the cycle is repeated.

This device has the drawback of requiring to orient the second wall below the first wall depending on the gravity forces to ensure fall of condensed drops.

DISCLOSURE OF THE INVENTION

Consequently, one goal of the present invention is to provide a device for recovering and converting heat energy into electrical energy using the phase change of a fluid, specially requiring no particular orientation and allowing a large miniaturisation.

The goal set out above is achieved by a device for recovering and converting heat energy into electrical energy comprising a first cavity one wall of which is for contacting a hot source, a second cavity one wall of which is for contacting a cold source, a piezoelectric material provided in at least one of the cavities, a primary channel connecting the first and second cavities and at least one secondary channel connecting the first and second cavities, the configuration of the primary channel being such that it ensures flowing of liquid drops from the second cavity to the first cavity.

In a first example, the primary channel can comprise an internal surface having a surface energy gradient oriented so as to cause the liquid drops to move from the second cavity to the first cavity. For example, in the case where the fluid is water, the surface comprises cross sections having different hydrophobicities, the cross sections being less and less hydrophobic towards the first cavity.

In another example, the main channel comprises a flow cross section raising towards the first cavity and a surface having at least one hydrophobicity property. Advantageously, the surface can have a decreasing hydrophobicity towards the first cavity.

In other words, the device comprises a condensation chamber and a vaporisation chamber connected by a channel ensuring the transfer of liquid drops from the condensation chamber to the vaporisation chamber without using gravity forces. At least one of the chambers comprises a membrane of piezoelectric material.

Therefore, one subject-matter of the present invention is a device for recovering and converting heat energy into electrical energy comprising at least one cell comprising:

- a first cavity at least one part of at least one wall of which is configured to contact a heat source,
- a second cavity at least one part of at least one wall of which is configured to contact a cold source,
- a primary channel connecting the first cavity and the second cavity for transporting a fluid as liquid drops, the primary channel comprising means providing transport of liquid fluid drops from the second cavity to the first cavity,
- at least one secondary channel connecting the first cavity and the second cavity for transporting the fluid as a gas,
- at least one piezoelectric material provided in at least one of the first and second cavities,
- a fluid as a liquid and gas contained within the cell,
- means for connecting said piezoelectric material to a device for recovering electrical energy generated by the piezoelectric material Advantageously, the moving means are formed by the inner surface of the primary channel having a surface energy gradient oriented such that liquid drops move from the second cavity to the first cavity.

In an exemplary embodiment, the surface energy gradient is obtained by at least one first and one second surface portions successively provided in this order between the second cavity and the first cavity, each of said portions having fluid-wettability properties, the wettability of the second portion being higher than that the first portion. The wettability properties can be obtained by a layer of a material having said wettability properties and/or by structuring at least one portion of the inner surface.

For example, the primary channel has a flow cross section raising from the second cavity to the first cavity.

At least one part of the inner surface of the primary channel on the side of the second cavity can have low fluid-wettability properties.

In another exemplary embodiment, the moving means are of the electrostatic type, for example implement the electrowetting phenomenon.

The primary channel can have a flared shape or comprise at least two successive segments having different flow cross sections, the flow cross sections increasing from the second cavity to the first cavity.

The flow cross section of the secondary channel can be such that it prevents liquid drops from flowing through. The cross section of the secondary channel is preferably lower than 0.1 time the capillary length.

According to an additional characteristic, the secondary channel opens into the second cavity in the proximity of one end of the primary channel opening into said second cavity.

The device for recovering and converting heat energy into electrical energy can advantageously comprise at least one first and one second cells, and a transfer channel connecting the first cavity of the first cell to the second cavity of the second cell and the second cavity of the first cell to the first cavity of the second cell.

Preferably, the walls of the first and second cavities are made of a good heat conducting material and wherein the device comprises an external element connecting the walls of the first and second cavities, said external element being of a heat insulating material.

The device advantageously comprises a piezoelectric material in the first and second cavities. The piezoelectric material(s) can contact the wall for contacting the hot source and/or cold source. The piezoelectric material(s) is (are) preferably as suspended membranes.

The diameter of the primary channel is for example lower than or equal to that of the liquid drops.

The volume of the first and/or second cavity can be between 1 and 10 times the volume of a liquid drop.

For example, the fluid implemented may be water or a solvent, for example a hydrofluoroether.

The device for recovering and converting heat energy into electrical energy can comprise a plurality of adjacent cells distributed with a variable density as a function of the local density of the heat flux emitted by the hot source.

Another subject-matter of the present invention is a system for recovering and converting heat energy into electrical energy comprising a device for recovering and converting heat energy into electrical energy according to the invention, wherein the temperature of the hot source is such that the wall of the first cavity contacting the same is at least equal to the boiling temperature of said fluid. For example, the hot source is formed by a portable electronic device.

BRIEF DESCRIPTION OF THE DRAWINGS

The present invention will be better understood using the description that follows and the appended drawings wherein:

FIGS. 4A to 4C are schematic longitudinal cross section views of different exemplary embodiments of a recovering and converting device according to a second embodiment, FIGS. 5A to 5D are top views of examples of distributing recovering devices according to the invention.

DETAILED DISCLOSURE OF PARTICULAR EMBODIMENTS

Figure 1:
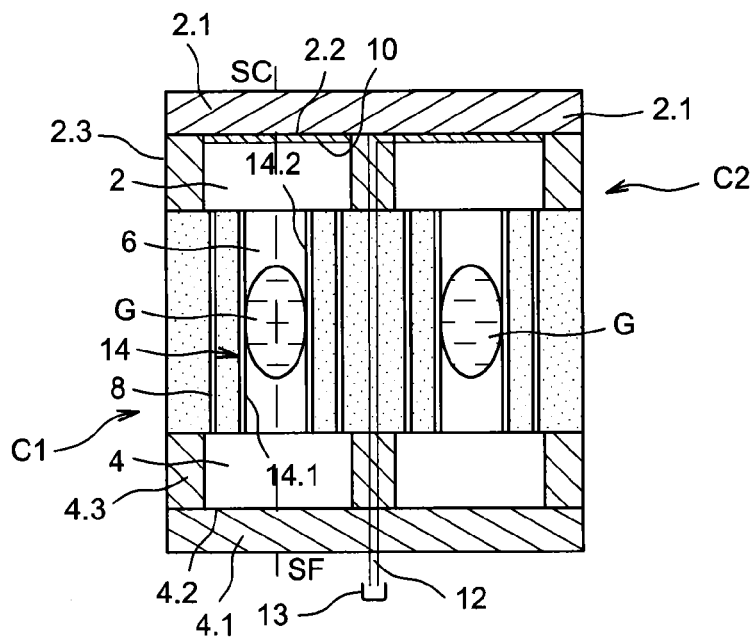
FIG. 1 is a schematic longitudinal cross section view of an exemplary embodiment of a recovering and converting device according to a first embodiment.

In FIG. 1, an exemplary embodiment of a recovering and converting device comprising a first cavity 2, a second cavity 4, a channel 6, called a primary channel connecting the first cavity 2 and the second cavity 4, and second channels 8, called secondary channels, connecting the first cavity 2 and the second cavity 4 can be seen. In the example represented, the primary channel extends along a longitudinal axis X. The assembly thus formed will be referred to as cells. The device represented in FIG. 1 comprises two cells C1 and C2.

The cavity 2 comprises a first and a second end wall 2.1, 2.2 and side walls 2.3. In the example represented, the first end wall 2.1 is for contacting a hot source HS; the wall 2.1 will be referred to as "hot wall" in the following of the description. The temperature reached by the hot wall 2.1 is such that it ensures vaporising of the fluid contained in the device. Therefore, it is at least equal to the boiling temperature of the fluid. Exemplary fluids will be given herein below.

The hot source HS can for example be a face of an electronic component or any other heat source.

The cavity 2 will be referred to in the following of the description as "chamber" or "vaporisation chamber".

The primary channel 6 passes through the end wall 2.2.

Preferentially, the walls of the cavity 2 are of the good heat conducting material so as to ensure a homogeneous distribution of temperature throughout the vaporisation cavity 2.

The second cavity 4 comprises a first and a second end wall 4.1, 4.2 and side walls 4.3. In the example, the end wall 4.1 comprises at least one wall 4.1 for contacting a cold source CS; the wall 4.1 will be referred to as "cold wall" in the following of the description. The temperature of the cold wall 4.1 is such that it ensures the condensation of the vapour formed in the vaporisation chamber 2. Thus, it is lower than the boiling temperature of the fluid.

The cold source CS is for example a fin radiator or directly ambient air.

The cavity 4 will be referred to in the following of the description as "chamber" or "condensation chamber".

The primary channel 6 passes through the second end wall 4.2.

Preferentially, the walls of the second cavity are also of a good heat conducting material so as to ensure homogeneous distribution of temperature throughout the condensation cavity 4.

Further, the external part 9 of the device, provided between the vaporisation chamber 2 and the condensation chamber 4 and surrounding the primary channel 6 and the secondary channels 8, is formed of a heat insulating material such as for example glass to avoid heat conduction from the hot wall 2.1 to the cold wall 4.1.

The device also comprises at least one element able to transform a mechanical stress into electrical energy. In the example represented, this is a membrane of piezoelectric material 10 provided in the cavity 2 against the hot wall 2.1.

Advantageously, the membrane 10 is suspended by its side ends. Only part of it is then contacting the hot wall 2.1 so as to promote the macroscopic deformation thereof and thus increase the quantity of electrical energy generated.

The piezoelectric membrane 10 is connected to an electrical energy collecting system, either directly a system 13 consuming the energy produced, or a storage system, such as a battery. The connections 12 and the system 13 are schematically represented. The connections can be made by brazing or soldering with a metal the melting temperature of which is lower than the melting temperature of the piezoelectric material. The connecting wires come out the device via channels made through the external part of insulating material 9, side walls 4.3 and the cold wall 4.1. These connections are made before assembling the hot 2.1 and cold 4.1 walls with the external part of insulating material 9.

Further, the primary channel 6 comprises an internal surface 14 such that it ensures the movement of the liquid drops G from the cavity 4 to the cavity 2. In the exemplary represented, the internal surface 14 comprises cross sections 14.1, 14.2, 14.3 having different wettability properties, the cross sections being distributed along the axis X, so as to form a surface with a surface energy gradient.

The cross sections are increasingly wetting towards the first cavity 2.

A surface has low liquid-wettability properties when the contact angle θ of a drop of said liquid is higher than 90°.

In the case of water, a low wetting surface is called a hydrophobic surface, and a wetting surface is called a hydrophilic surface. In the following of the description, the case of water will be considered for the sake of simplicity, but the invention is not restricted to water.

The wetting properties can be achieved by depositing materials having different wetting affinities with the fluid. For example, SiOx which has a low water-wettability can be deposited; the contact angle is between 20° and 40° or graphite fluorides (CFx) which are of a hydrophobic character as well. The wettability level can also be modified by structuring, advantageously nanostructuring the inner surface of the primary channel 6. By making two different nanostructurations, two cross sections having different wettabilities can be made. The nanostructuration can take the form of nanoscale to microscale bowls provided at the surface of the material.

The flow cross section of the primary channel 6 is higher than that of the secondary channels 8, and is such that it allows liquid drops to be flown whereas the secondary channels 8 are intended to allow only vapour flow.

In the case of water, preferably the diameter of the primary channel is in the order of the capillary length, that is between 3 mm and 5 mm, advantageously in the order of 4 mm; preferably, the diameter of the secondary channel is in the order of the capillary length divided by 10, that is the diameter of the secondary channels is for example lower than 0.4 mm.

In the example represented, the device comprises several secondary channels 8. For example, they are distributed throughout the primary channel. It could be contemplated that there is only one secondary channel which has an annular shape and completely surrounds the primary channel.

The operation of the recovering and converting device of FIG. 1 is the following one: a fluid drop is abruptly evaporated in the vaporisation chamber 2 by contacting the hot wall 2.1 which is at a temperature higher than the boiling temperature of the fluid. The abrupt evaporation generates a pressure peak in the chambers 2 and 4 and in the primary 6 and secondary 8 channels under the effect of the gas containment. This variation in pressure triggers a deformation of the piezoelectric membrane 10, which generates an electrical voltage/current at the terminals thereof which is transported by the connexions 12 to the consuming or storage system 13. The fluid in the gas state is nearly instantly distributed in the volume of the chambers 2.4 and the channels 6.8 and is condensed into a fluid drop in the chamber 4 on contacting the cold wall 4.1. The condensed drop is thus subjected to two forces: on the one hand, it is attracted into the primary channel 6 from the chamber 4 to the chamber 2 by the inner surface having a surface energy gradient, this energy gradient created by the physicochemical characteristics of the inner wall 14 of the primary channel 6 enables the drop to minimize its energy by moving along the primary channel 6.

On the other hand, it is also pushed in the same direction by the pressure transmitted from the chamber 2 which is heated up towards the chamber 4 by the secondary channels 8 the size of which is too small to let pass a drop but sufficiently large to transmit the pressure. The secondary channels 8 have also the function not to let an under-pressure to be generated in the chamber 4 because of the drop movement. Therefore, they enable the pressure to be joined to the drop when transferring from the chamber 4 to the chamber 2. As soon as it arrives in the same, the drop is again abruptly vaporised and the cycle is repeated.

The cell size and the fluid volume are for example such that a single drop flows in the channel and then is vaporised and condensed.

The operation of the device thus results in pressure peaks which are cyclic, from a hot source HS the temperature of which varies little or not or then the temperature of which varies slowly. These pressure peaks are converted into electricity by the piezoelectric membrane 10.

The electrical signals are available on the connections of the membrane 10 and are cyclic over time. They can thus be operated by energy recovering electronic circuits and processed to be stored and/or used.

In the example of FIG. 1, the device comprises two distinct cells C1 and C2, however a device with a single cell does not depart from the scope of the present invention. Advantageously, a great number of juxtaposed cells is provided so as to maximise the quantity of electrical energy recovered.

The cells can be evenly distributed or not by making for example density differences to locally and controllably adjust the heat flux density passing through this structure.

Figure 2:
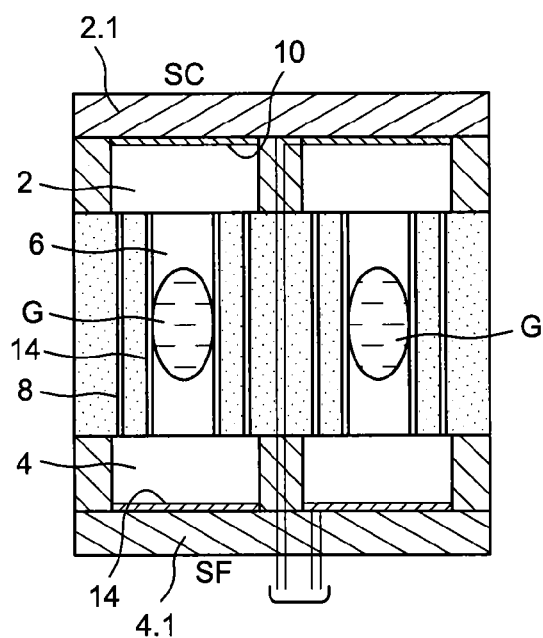
FIG. 2 is a schematic longitudinal cross section view of an alternative of the device of the FIG. 1.

In FIG. 2, an alternative of the device of FIG. 1 can be seen, wherein a piezoelectric membrane 14 is also provided in the condensation chamber 4. As for the membrane 10, this is even advantageously suspended to the cold wall 4.1.

A piezoelectric membrane could also be provided only in the condensation chamber 4.

Alternatively, piezoelectric membranes could be provided at the sidewalls and/or in the secondary channels.

Figure 3:
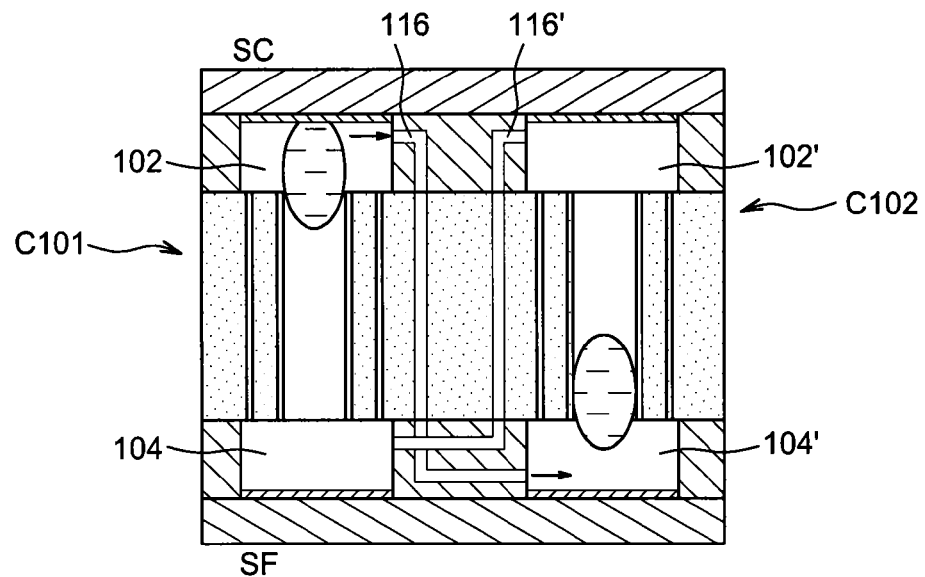
FIG. 3 is a schematic longitudinal cross section view of another exemplary embodiment of the device according to the first embodiment.

In FIG. 3, another exemplary device wherein two cells are interconnected can be seen.

Each cell C101, C102 is similar to the cells C1 and C2 of FIGS. 1 and 2. The device however comprises a channel 116 connecting the chamber 102 of the cell C101 to the condensation chamber 104' of the cell C102 and a channel 116' connecting the vaporisation chamber 102' of the cell C102 to the condensation chamber 104 of the cell C101. The channels 116 and 116' are for transferring the pressure generated in the vaporisation chambers 102, 102' to the condensation chamber 104', 104 of the other cell.

Secondary channels 108 connect the chamber 102 and the chamber 104.

In this exemplary embodiment, besides the forces exerted by the surfaces having a surface energy gradient of the primary channels, it is the pressure of the gas generated by vaporising a drop into the vaporisation chamber 102 of the cell C101 which generates the force for moving the drop from the condensation chamber 104' to the vaporisation chamber 102' of the cell C102, and it is the pressure of the gas generated by vaporising a drop into the vaporisation chamber 102', which generates the force for moving the drop from the condensation chamber 104 to the vaporisation chamber 102 of the cell C101 as shown in FIG. 3. Thus, there is a fluid transfer from cell to cell.

In this exemplary embodiment, this coupling advantageously causes the cells to be driven among each other.

Alternatively, the surfaces with a surface energy gradient can be replaced by surfaces having electrowetting type electrical bias effects. For this, an electrode array is provided in the wall of the primary channels and they are gradually activated to move the drop.

In FIGS. 4A to 4B, examples of another embodiment can be seen, wherein the shape of the primary channel varies.

The primary channel 206 comprises a variable flow cross section along the axis X. More particularly, it comprises a flow cross section along the axis X raising from the condensation chamber 204 to the vaporisation chamber 202. A piezoelectric membrane 210, 214 is provided in each chamber 202, 204. Further, it has a low wetting surface, or hydrophobic one in the case of water. Secondary channels 208 are also provided.

In FIG. 4A, the wall of the primary channel 206 has the shape of a truncated cone.

In FIG. 4B, the radius of the primary channel 206' non-linearly increases along the axis X in such a way that the internal surface of the primary channel has a convex profile.

In FIG. 4C, the primary channel 206" is comprised of tubular portions 206.1", 206.2", 206.3" having an increasing cross section, three in the example represented.

A liquid drop advancing in the primary channels is represented in all the three FIGS. 4A to 4C.

It could be contemplated to combine for example the shapes of the FIGS. 4A and 4C or 4B and 4C. The cross sections 206.1, 206.2, 206.3 would then be no longer of a constant radius but would have a cone shape or a convex internal surface. Any other shape facilitating the directional movement of the liquid drops is worth considering.

In another exemplary embodiment, the primary channel of FIGS. 4A to 4C can have a surface with a surface energy gradient and/or an electric bias effect.

The exemplary embodiment of FIG. 3 wherein two cells C101, C102 are coupled can be implemented with the devices of FIGS. 4A to 4C.

As explained above with FIG. 5D, the device can comprise cells of different types. For example, the cells could have different means to move the drop depending on the cells and the arrangement.

The dimensions of the primary channel and the vaporisation and boiling chambers are selected as a function of the drop size. The diameter of the primary channel is preferably lower than or equal to that of the drop for surface effects to intervene. The vaporisation and boiling chambers have preferably a volume between 1 and 10 times the drop volume to maximise the containment effect and the amplitude of the pressure peaks.

In the example represented, the channels can be straight ones or can have more complex geometries. Further, the cross section of the channels can be circular, elliptic, parallelepipedic or any other else.

Figure 6:
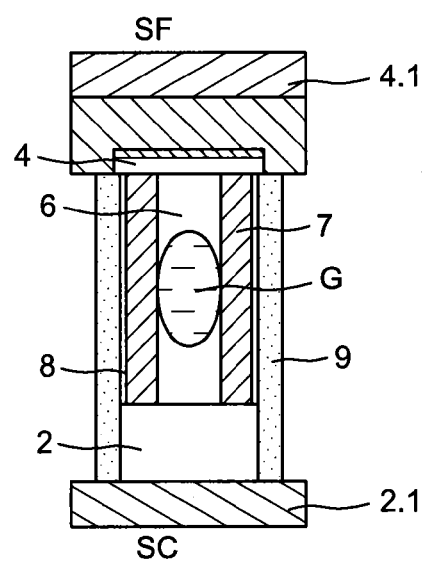
FIG. 6 is a longitudinal cross section view of a practical exemplary embodiment of a recovering and converting device according to the invention.

In FIG. 6, a practical exemplary embodiment of the device similar to that of FIG. 1 provided with a single cell can be seen.

The device comprises a hot wall 2.1 at a temperature between 110° C. and 150° C., a cold surface 4.1 at a temperature between 50° C. and 80° C., a glass tube 9 connecting the hot wall 2.1 and the cold wall 4.1.

The primary channel 6 is formed by a stainless steel tube. An annular secondary channel 8 is bounded between the stainless steel tube 9 and the glass tube 9, the same has a thickness 0.5 mm. The diameter of the primary channel 6 is for example between 1 mm and 4 mm.

The condensation chamber 4 has a height in the order of 0.5 mm and a diameter in the order of about 10 mm and a vaporisation chamber 2 as a diameter of 15 mm and a height between 1 mm and 3 mm.

For example, the heat sources usable and having temperatures in the order of 110° C. to 150° C. are for example plant pipings equipped with autonomous sensors powered by the device according to the invention, or hardly reachable buried pipings equipped with autonomous sensors fed by the device according to the invention.

In FIGS. 5A to 5D, exemplary distributions of cells can be seen. The distribution of cells can enable the thermal management to be optimised for example by discharging a thermal flux higher in the center of the device than on the sides. In FIG. 5A, the device comprises a single cell C1. In FIG. 5B, the device comprises a plurality of cells C1, C2, C3 . . . distributed as a matrix. In FIG. 5C, the cells are distributed as an eight-branch star scheme.

In FIG. 5D, this is the same distribution as that of FIG. 5C but with two types of cells C1, C2, C3 . . . and C1', C2', C3' . . . having different properties so as to adjust their performances or their operating ranges and for example to be able to meet different temperature ranges using fluids having different boiling temperatures, for example water and ethanol. The cells can thus have different dimensions.

In the case of a macroscale device, the different elements can be made by machining or any other suitable technique.

In the case of a microscale device, microelectronic techniques, such as depositing insulating films, conducting wires, lithographies, reactive ion etchings (RIE) etc. can be used. Further, the materials used can be other than those used in microelectronics, for example insulating ceramics, polymers . . . .

The piezoelectric membranes can be in the form of microscale membranes or deposited as thin layers.

The surface having a surface energy gradient could for example be obtained by chemical vapour deposition (CVD) of low to high wettability materials.

For example, to make the different cross sections having different wettability properties, part of the primary channel may for example be protected by a sacrificial material such as a resin, so as to deposit afterwards the low or high wetting material. The resin is then removed. In a second step, the first part deposited could in turn be protected by a resin, so as to deposit onto the second part of the channel the complementary high or low wetting material. Thus, channels having a surface energy gradient along axes can be made.

In the case of drops having a small diameter, for example lower than one millimeter, a surface thus made ensures a better control of the drop movement.

By way of example, the materials implemented can be:
for heat conducting materials, it can be a metal such as copper, aluminium, etc. It can be anisotropic materials such as graphite, nanocomposites comprising carbon nanotubes,
for heat and electric insulating materials, a polymer, silica or an insulating ceramic such as zirconia or alumina can be selected,
to make the surface having a surface energy gradient, the materials may be SiOx or CFx, with nanostructured surfaces.

For example, the membrane(s) of piezoelectric material can be of PZT, PLZT, PMNT, PMNZ or of PFW.

Finally, the fluid implemented can be water, solvents, fluids used in thermal applications, particle-filled fluids or mixtures of these fluids. Among the preferred solvents, hydrofluoroethers can be mentioned.

The device according to the invention enables, thanks to the use of a phase change, heat energy to be recovered and converted into electricity by a means for generating periodic pressure and electrical voltage/current peaks suitable for being efficiently used by energy recovering electronic circuits.

This device enables, thanks to the implementation of primary channels comprising inner surfaces with a surface energy gradient, primary channels having suitable geometries, or channels having a suitable electric bias, or a combination of these means, as well as secondary channels, a drop transfer force to be generated which enables devices to be miniaturised to characteristic dimensions of channels in the order of 10 µm to several millimeters, and devices to be used in all the positions, comprising when the hot source is located below the cold source or when the axis is in an horizontal position. This freedom in orienting the device is particularly interesting in the case of a hot source formed by a solar device which is located in an upper part, or of mobile devices or portable electronic devices the orientation of which can vary in use.

Further, the device according to the invention enables, thanks to cell density adaptations, i.e. number of cells per unit area, the heat flux density transferred by these architectures to be controlled.

The device according to the invention suitable for the heat energy recovery and its conversion into electrical energy may be used for powering low consumption electronic devices, for example autonomous sensors.

Further, using fluids having a suitable boiling temperature, devices operating at different temperatures can be manufactured.

Consequently, besides using heat to produce heat energy, this device results in discharging heat, then as well as generating power, it plays the role of a cooling system.

The device according to the invention can also be used as a thermal management device by adapting the liquid amount in each cell and the number of cells and the position thereof as a function of the temperatures of the zones desired to be thermally managed. This management can be fully passive or be at least partly active in the case where electrowetting is implemented.

The invention claimed is:

1. A device for recovering and converting heat energy into electrical energy comprising at least one cell comprising:
    a first cavity, at least one part of at least one wall of which is configured to contact a heat source;
    a second cavity, at least one part of at least one wall of which is configured to contact a cold source;
    a primary channel connecting the first cavity and the second cavity and configured to transport a fluid as liquid drops, the primary channel comprising means providing transport of liquid fluid drops from the second cavity to the first cavity;
    at least one secondary channel connecting the first cavity and the second cavity and configured to transport the fluid as a gas;
    at least one piezoelectric material provided in at least one of the first and second cavities;
    a fluid as a liquid and gas contained within the cell;
    at least one connector to connect the piezoelectric material to a device for recovering electrical energy generated by the piezoelectric material.

2. The device for recovering and converting heat energy into electrical energy according to claim 1, wherein the means providing transport of liquid fluid drops includes an inner surface of the primary channel having a surface energy gradient oriented such that the liquid drops move from the second cavity to the first cavity.

3. The device for recovering and converting heat energy into electrical energy according to claim 2, wherein the surface energy gradient is obtained by at least a first and a second surface portion successively arranged in this order between the second cavity and the first cavity, each of the portions having fluid-wettability properties, the wettability of the second portion being higher than that of the first portion.

4. The device for recovering and converting heat energy into electrical energy according to claim 3, wherein the wettability properties are obtained by a layer of a material having the wettability properties and/or by structuring at least one portion of the inner surface.

5. The device for recovering and converting heat energy into electrical energy according to claim 1, wherein the means providing transport of liquid fluid drops is of electrostatic type, or implement an electro-wetting phenomenon.

6. The device for recovering and converting heat energy into electrical energy according to claim 1, wherein the primary channel has a flow cross section raising from the second cavity to the first cavity.

7. The device for recovering and converting heat energy into electrical energy according to claim 6, wherein at least one part of an inner surface of the primary channel on a side of the second cavity has low fluid-wettability properties.

8. The device for recovering and converting heat energy into electrical energy according to claim 6, wherein the primary channel has a flared shape.

9. The device for recovering and converting heat energy into electrical energy according to claim 6, wherein the primary channel includes at least two successive segments having different flow cross sections, the flow cross sections increasing from the second cavity to the first cavity.

10. The device for recovering and converting heat energy into electrical energy according to claim 1, wherein the flow cross section of the secondary channel prevents liquid drops from flowing through.

11. The device for recovering and converting heat energy into electrical energy according to claim 1, wherein the secondary channel opens into the second cavity in proximity of one end of the primary channel opening into the second cavity.

12. The device for recovering and converting heat energy into electrical energy according to claim 1, comprising at least a first cell and a second cell, and a transfer channel connecting the first cavity of the first cell to the second cavity of the second cell and the second cavity of the first cell to the first cavity of the second cell.

13. The device for recovering and converting heat energy into electrical energy according to claim 1, wherein the walls of the first and second cavities are made of a heat conducting material, and wherein the device comprises an external element connecting the walls of the first and second cavities, the external element being of a heat insulating material.

14. The device for recovering and converting heat energy into electrical energy according to claim 1, comprising a piezoelectric material in the first and second cavities.

15. The device for recovering and converting heat energy into electrical energy according to claim 1, wherein the piezoelectric material contacts the wall configured to contact the heat source and/or the cold source.

16. The device for recovering and converting heat energy into electrical energy according to claim 1, wherein the piezoelectric material includes a suspended membrane.

17. The device for recovering and converting heat energy into electrical energy according to claim 1, wherein a diameter of the primary channel is lower than or equal to that of the liquid drops.

18. The device for recovering and converting heat energy into electrical energy according to claim 1, wherein a volume of the first and/or second cavity is between 1 and 10 times a volume of a liquid drop.

19. The device for recovering and converting heat energy into electrical energy according to claim 1, wherein the fluid is water or a solvent, or is a hydrofluoroether.

20. The device for recovering and converting heat energy into electrical energy according to claim 1, comprising a plurality of adjacent cells, the cells being distributed with a variable density as a function of a local density of a heat flux emitted by the heat source.

21. A system for recovering and converting heat energy into electrical energy comprising a device for recovering and converting heat energy into electrical energy according to claim 1, wherein a temperature of the heat source is such that a temperature of the wall of the first cavity contacting the same is at least equal to a boiling temperature of the fluid.

22. The system for recovering and converting energy into electrical energy according to claim 21, wherein the heat source includes a portable electronic device.

* * * * *